United States Patent [19]

Sukeda et al.

[11] Patent Number: 4,459,679

[45] Date of Patent: Jul. 10, 1984

[54] MAGNETIC BUBBLE MEMORY DEVICE CASSETTE

[75] Inventors: Toshiaki Sukeda, Nagano; Shiro Naoi, Suzaka; Harumi Maegawa, Kawasaki, all of Japan

[73] Assignee: Fujitsu Limited, Kawasaki, Japan

[21] Appl. No.: 192,804

[22] Filed: Oct. 1, 1980

[30] Foreign Application Priority Data

Oct. 4, 1979 [JP] Japan ............................ 54-137612[U]
Oct. 4, 1979 [JP] Japan ............................ 54-137613[U]
Dec. 20, 1979 [JP] Japan ............................ 54-176759[U]
Jun. 26, 1980 [JP] Japan ............................ 55-89881[U]

[51] Int. Cl.³ ............................................. G11C 19/08
[52] U.S. Cl. ...................................................... 365/1
[58] Field of Search .................... 365/1; 360/60, 132, 360/133, 137; 369/10, 11, 12

[56] References Cited

U.S. PATENT DOCUMENTS

| | | | |
|---|---|---|---|
| 3,486,675 | 12/1969 | Krechman | 360/132 |
| 3,721,772 | 3/1973 | Miura et al. | 360/132 |
| 3,825,947 | 7/1974 | Rubin et al. | 360/60 |
| 3,828,363 | 8/1974 | Somers | 360/60 |

FOREIGN PATENT DOCUMENTS 54-43427  4/1979  Japan .................................... 365/2
914247  12/1962  United Kingdom ................ 360/60

OTHER PUBLICATIONS

Electronics–May 5, 1981–vol. 54, No. 9, pp. 149–151.

*Primary Examiner*—James W. Moffitt
*Attorney, Agent, or Firm*—Staas & Halsey

[57] ABSTRACT

A cassette type magnetic bubble memory device is dismountably attached to a main apparatus, having a bubble driving circuit, a bubble writing circuit and a bubble reading circuit, and which comprises a case and, contained therein, a magnetic bubble memory element including at least a bubble chip, a coil for producing a revolving magnetic field and a magnet for producing a bias magnetic field. A writing-inhibiting member is mounted on the surface of the case to hold the state of inhibition of the writing operation in the magnetic bubble memory element. This writing-inhibiting member is arranged so that the state of inhibition of the writing operation and the state of allowance of the writing operation can be switched by a manual operation. A lock mechanism for preventing separation of the cassette while a revolving magnetic field is produced and a converse insertion-inhibiting mechanism for inhibiting converse insertion of the cassette when the cassette is being attached to the main apparatus are also provided.

18 Claims, 24 Drawing Figures

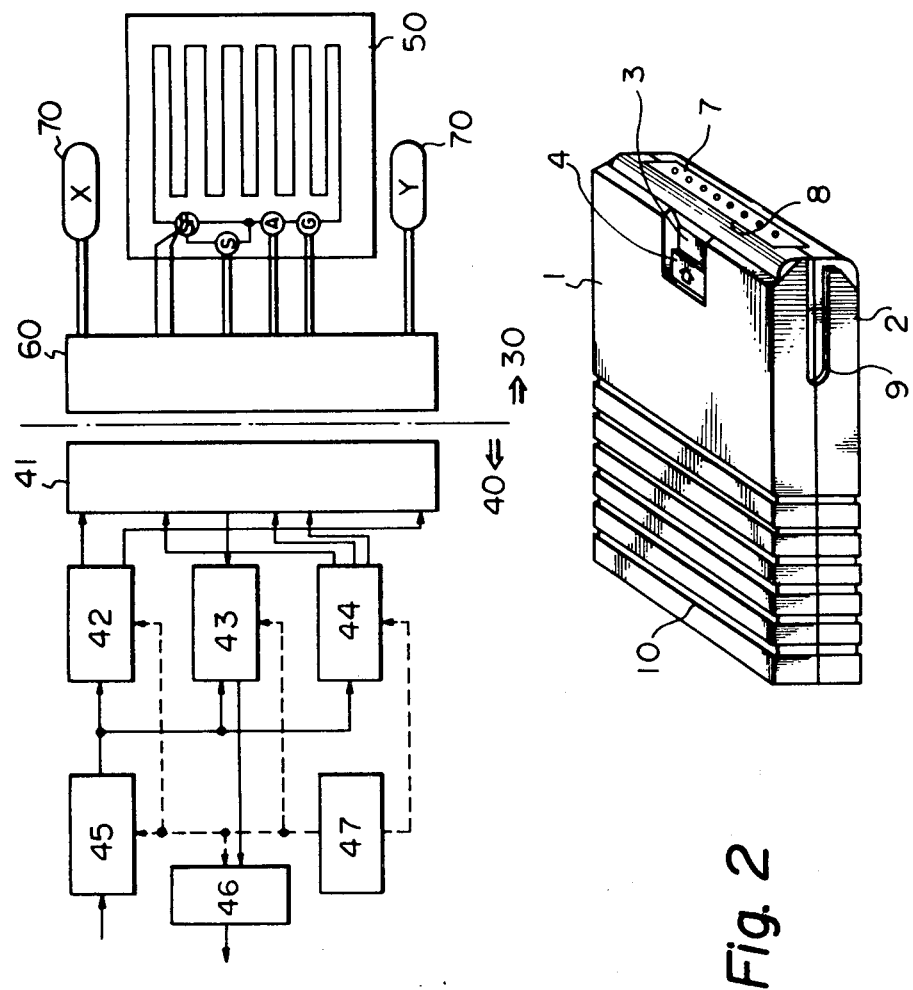

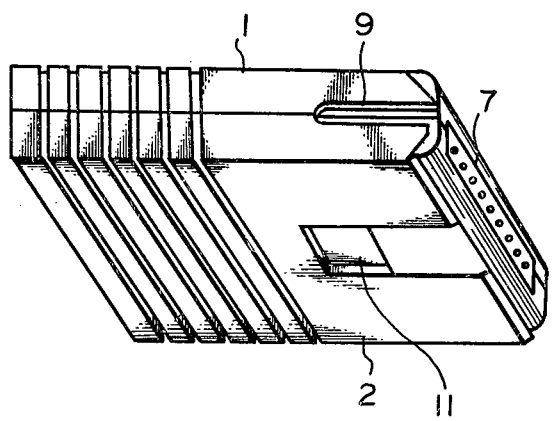
Fig. 3
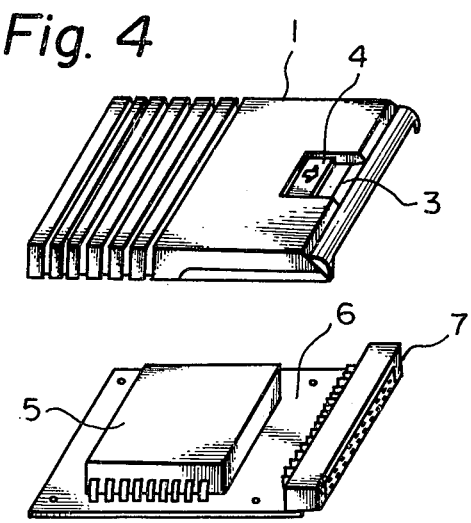
Fig. 4
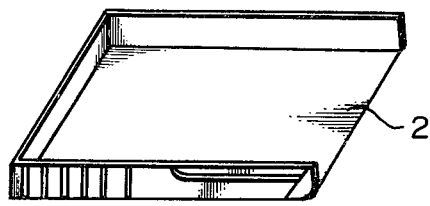

MAGNETIC BUBBLE MEMORY DEVICE CASSETTE

BACKGROUND OF THE INVENTION (1) Field of the Invention

The present invention relates to a cassette type magnetic bubble memory device which is dismountably attached to a main apparatus comprising a bubble driving circuit and a bubble reading circuit.

(2) Description of the Prior Art

An apparatus utilizing a magnetic bubble memory device for storage of information and performance of logical operation has various advantageous characteristics, such as having a non-volatile memory, a high memory density, a small power consumption, a small size and being light weight. Moreover, since the magnetic bubble memory device is a solid device, which does not include any mechanical element and thus has a very high reliability, great expectations are held for future utilization of this magnetic bubble memory device as a console unit memory or the like. When the magnetic bubble memory device is used as a console unit memory, for example, a memory medium of a portable data recorder, the characteristics of small size and light weight are especially important among the above-mentioned characteristics of the magnetic bubble memory device. Under such background, there has recently been proposed a method in which a magnetic bubble memory device is contained in a cassette separately from a main apparatus comprising a driving circuit and a reading circuit and the cassette type magnetic bubble memory device is dismountably attached to the main apparatus. When this method is adopted, since information can be conveyed very simply and since relatively large quantities of information can be contained in a compact cassette by virtue of the characteristic properties of the magnetic bubble memory device, information to be put into a central processing unit can be formed directly at a place where data occur and therefore, further increase of the processing efficiency can be expected.

In the conventional cassette type magnetic bubble memory device, the writing and reading operations of the bubble memory device are performed only on the soft portion of a program prepared for operation of the magnetic bubble memory device. In the case where the writing and reading operations are performed only on the soft portion of the program, it sometimes happens that an operation of a different subroutine is performed because of an error of the subroutine on the program or an error of the program operation, and in this case, information stored in the magnetic bubble memory device is destroyed. Furthermore, pulse signals produced by noises or the like are introduced into the writing circuit and different information bubbles are produced in the bubble memory device.

Since the conventional cassette type magnetic bubble memory device can easily be dismounted from the main apparatus, it sometimes happens that during the operation of the device, that is, while a revolving magnetic field is being produced, the cassette type magnetic bubble memory device is taken out from the main apparatus by mistake or accident, with the result that information stored in the memory device is destroyed or contents of information is changed during the reading or writing operation of the main apparatus to reduce the reliability of the device.

Furthermore, since the cassette type magnetic bubble memory device is light and is easy to carry and handle, the cassette is frequently attached and dismounted and it often happens that the cassette is inserted conversely to the main apparatus. In order to prevent this converse insertion of the cassette, the connector-joining face of the cassette is formed to have a trapezoidal shape so that converse insertion is not allowed because of the difference of the shape between the left and right sides of the cassette. Even in this case, if the cassette is conversely inserted by a strong force, a gate pin of the joining face of the connector of the cassette is caused to fall in contact with the connector-joining face of the main apparatus, whereby the bubble memory device is readily destroyed. Accordingly, erroneous contact cannot be substantially avoided if only the joining face has a trapezoidal shape.

As pointed out before, the cassette type magnetic bubble memory device is light and is easy to carry and handle. This means that the frequency of unexpected encounters with a disturbance magnetic field is increased. For example, there is a fear of attachment of a small permanent magnet to the cassette. Since the magnetic bubble memory device has a magnetic memory element, if it is exposed to a disturbance magnetic field, there is a risk of destroying the information stored in the cassette type magnetic bubble memory device. Accordingly, a magnetic bubble chip is protected by a shield so that even if a disturbance magnetic field of about 50 to about 100 Oe is uniformly applied, the information stored in the interior of the magnetic bubble memory device is not destroyed. However, a small magnet or the like produces a local magnetic field of about 300 to about 400 Oe. Accordingly, in the cassette type magnetic bubble memory device, for which various application modes are considered, appropriate countermeasures to cope with the foregoing disadvantages should be taken.

SUMMARY OF THE INVENTION

It is therefore a primary object of the present invention to provide a cassette type magnetic bubble memory device having a simple structure and being light weight, portable, and easy to handle, in which the above-mentioned defects are eliminated by provision of a cassette holding system including a lock mechanism for preventing separation of the cassette while a revolving magnetic field is produced and a converse insertion-inhibiting mechanism for inhibiting converse insertion of the cassette when the cassette is being attached to the main apparatus.

Another object of the present invention is to provide a cassette type magnetic bubble memory device which has such a structure that a sufficiently high resistance is ensured against a body or substance which is smaller than the magnetic bubble memory device but produces locally a very strong disturbance magnetic field, whereby the reliability of information is enhanced.

In accordance with the present invention, these and other objects can be attained by a cassette type magnetic bubble memory device which is dismountably attached to a main apparatus comprising a bubble driving circuit, a bubble writing circuit and a bubble reading circuit and which comprises a case and, contained therein, a magnetic bubble memory element including at least a bubble chip, a coil for producing a revolving magnetic field and a magnet for producing a bias magnetic field, said cassette type magnetic bubble memory device further comprising a writing-inhibiting member mounted on the surface of said case to hold the state of inhibition of the writing operation to said magnetic bubble memory element, said writing-inhibiting member being arranged so that the state of inhibition of the writing operation and the state of allowance of the writing operation can be switched over to each other by a manual operation.

BRIEF DESCRIPTION OF THE DRAWINGS

FIG. 1 is a circuit diagram of one embodiment of the cassette type magnetic bubble memory device according to the present invention.

FIG. 2 is a perspective view, seen from above, of the cassette type magnetic bubble memory device according to the present invention.

FIG. 3 is a perspective view, seen from below, of the cassette type magnetic bubble memory device shown in FIG. 2.

FIG. 4 is a fragmentary perspective view of the cassette type magnetic bubble memory device shown in FIG. 2.

DETAILED DESCRIPTION OF THE PREFERRED EMBODIMENTS

Figure 5:
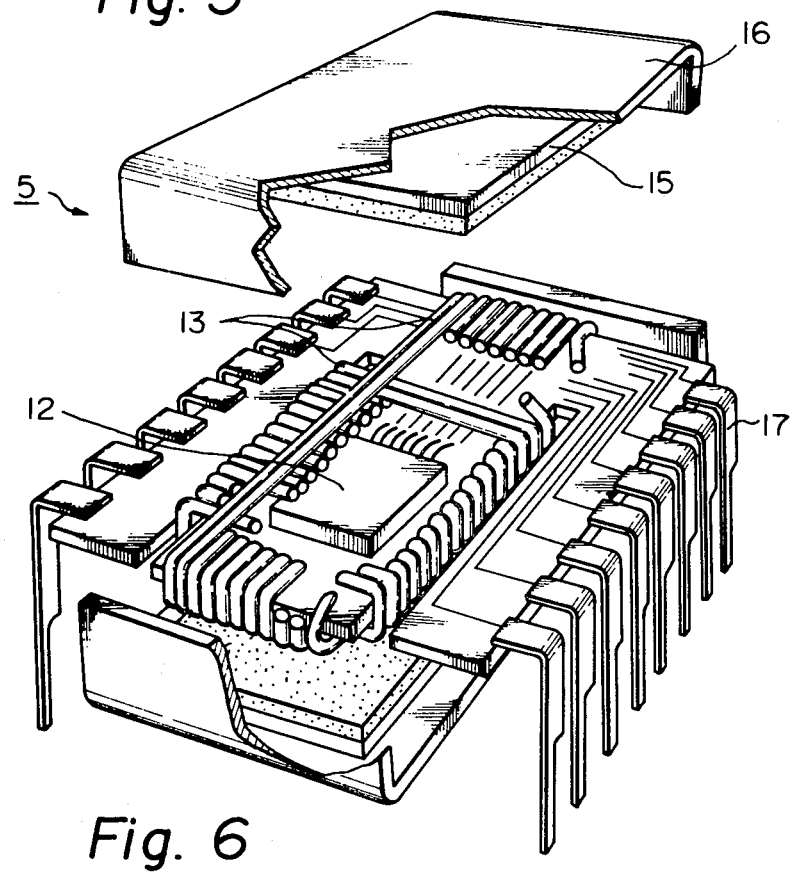
FIG. 5 is a perspective view illustrating the interior of the magnetic bubble memory element.

Referring to FIG. 1 illustrating the circuit structure of one embodiment of the cassette type magnetic bubble memory device according to the present invention, a cassette type magnetic bubble memory device 30 is dismountably attached to a main apparatus 40. A bubble chip 50 includes functional elements such as a magnetic bubble generator G, a divider SP, a sensor S and an eraser A. A magnetic bubble memory element having a single loop structure is shown in FIG. 1, but a magnetic bubble memory element having a major-minor loop structure can also be similarly used. Reference numeral 60 represents a connector and reference numeral 70 represents a revolving magnetic field-generating coil including X and Y coils arranged to cover the bubble chip 50. Reference numeral 41 represents a connector corresponding to the connector 60 disposed on the side of the cassette 30. A coil driving circuit 42 is laid out to supply a sine or chopping wave current to the coil 70 to generate a revolving magnetic field along the bubble chip face. Reference numeral 43 represents a bubble reading circuit and reference numeral 44 represents a magnetic bubble control circuit including a bubble writing circuit for applying an electric current to the magnetic bubble generator G to generate bubbles, a circuit for applying an electric current to the divider SP to divide bubbles, a circuit for applying an electric current to the sensor S to detect the absence or presence of bubbles and a circuit for applying an electric current to the eraser A to erase unnecessary bubbles. A control circuit 45 is laid out to control the coil driving circuit 42, the bubble reading circuit 43 and the magnetic bubble control circuit 44 according to instruction signals from a central processing unit. Reference numerals 46 and 47 represent a register and a current circuit, respectively. By adoption of the above-mentioned structure, the portable cassette type magnetic bubble memory device, having a relatively small volume, can be joined to the main apparatus through connectors and can be operated in this joined state when necessary.

FIGS. 2 through 4, illustrate upper and lower cases 1 and 2 formed by a box-like mold, a recessed portion 3, a slide plate 4 acting as the writing-inhibiting member, a magnetic bubble memory element 5, a printed board 6 and a connector 7.

The upper case 1 has the recessed portion 3 on the outer surface thereof on the insertion end, and the slide plate 4 is slidably attached to the recessed portion 3. The upper case 1 and lower case 2 are integrated with each other to form a magnetic bubble memory element-containing cassette. The cassette has an opening 8 for exposing the connector 7 to the insertion end face thereof. Grooves 9 for preventing erroneous insertion, which are different in width, are formed on both sides of the cassette, and a plurality of slip-preventing grooves 10 are formed on the rear end portion of the cassette so as to facilitate attachment and dismounting of the cassette. Furthermore, a dent 11 is formed to lock the cassette to the main apparatus.

As shown in FIG. 5, the magnetic bubble memory element 5 includes in the interior thereof a bubble chip 12, X and Y coils 13 for generating a revolving magnetic field for driving bubbles in the bubble chip 12, a magnet plate 15 for generating a bias magnetic field for stably holding bubbles in the bubble chip 12 and a shield case 16 for protecting information in the bubble chip 12 from a disturbance magnetic field. Reference numeral 17 represents a lead line terminal.

Figure 6:
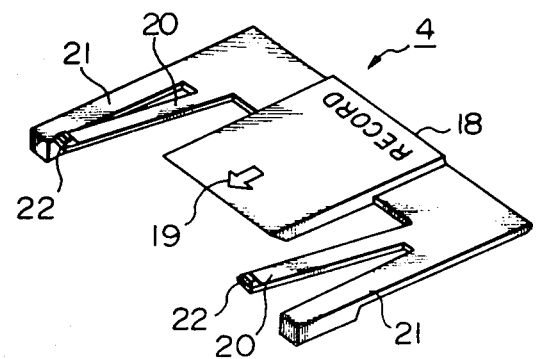
FIG. 6 is a perspective view showing an example of a slide plate in the cassette type magnetic bubble memory device according to the present invention.

FIG. 6 is an enlarged perspective view illustrating the slide plate 4, which is formed by using a mold. A central body portion 18 of the slide plate 4 has an arrow-shaped concave portion 19, and two arms 20 and 21 are extended from both sides of the body portion 18. The arm 20 is inclined and a projection 22 is formed on the end portion thereof.

Figure 7:
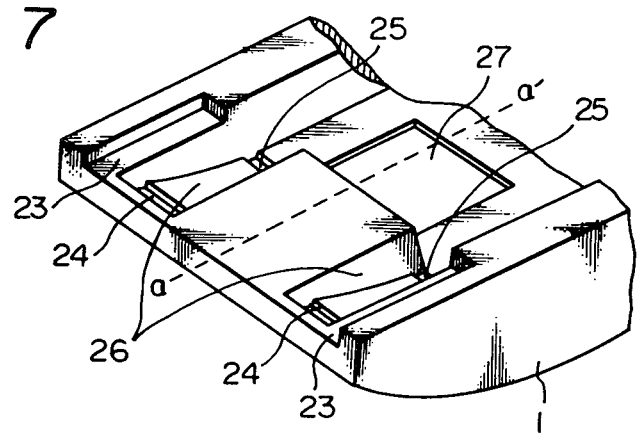
FIG. 7 is a perspective view showing a part of the cassette type magnetic bubble memory device according to the present invention.

The slide plate 4 is attached to the upper case 1 from the inner side thereof. The inner side of the upper case 1 is illustrated in FIG. 7. Steps 23 for receiving the connector 7 are formed on both side walls of the end portions of the inner side of the upper case 1, and inclined grooves 26 are formed on the inner sides of the steps 23 to contain the arms 20 and 21 of the slide plate 4 therein, respectively. Anchoring grooves 24 and 25 are formed on both end portions of the bottom face of each of the inclined grooves 26 so that the projection 22 of the arm 20 can be engaged with the anchoring grooves 24 and 25. A recessed portion 27 is formed on the bottom face of the case between both inclined grooves 26 so that the body portion 18 of the slide plate 4 can be engaged with this recessed portion 27, and as shown in FIG. 8, the insertion side edge of the recessed portion 27 is communicated with the concave portion 3.

Figure 8:
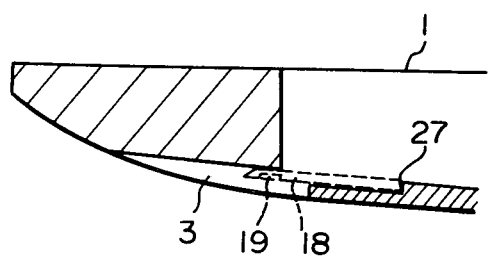
FIG. 8 is a view showing the section taken along the line a—a' in FIG. 7.

Attachment of the slide plate 4 to the upper case 1 is accomplished by turning over the slide plate 4 in the state shown in FIG. 6, arranging the body portion 18 in the recessed portion 27 as indicated by a dot line in FIG. 8 and locating the arms 20 and 21 within the inclined grooves 26. In this attachment state, the arm 20 presses the bottom face of the inclined groove 26 by its own elastic force to pull up the body portion 18 of the slide plate 4 and bring the end of the body portion 18 into butting contact with the bottom face of the recessed portion 3. In this attachment state, for example, when the projection 22 is engaged with the anchoring groove 25, the body portion 18 of the slide plate 4 is located within the recessed portion 27 and therefore, only the end of the body portion 18 is located within the recessed portion 3. Accordingly, the concave portion 3 is kept open (the state shown in FIG. 8). In this state, if a pencil point or the like is inserted into the arrow-shaped concave portion 19 and the body portion 18 of the slide plate 4 is pulled out by manual operation, the projection 22 which has been engaged with the anchoring groove 25 is separated from the anchoring groove 25 and becomes engaged with the anchoring groove 24, whereby the concave portion 3 is kept blocked by the body portion 18 of the slide plate 4. If the body portion 18 of the slide plate 4 is pushed inward in this state, the original open state is restored in the recessed portion 3.

As is seen from the foregoing illustration, the opened state and closed state are set for the concave portion 3 by the slide plate 4, and such states are maintained and held by engagement of the projection 22 with the anchoring groove 24 or 25.

Figure 9:
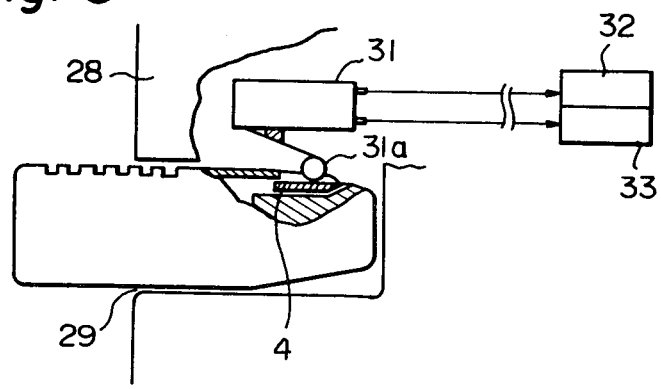
FIGS. 9 and 10 are sectional views showing different application modes of the cassette type magnetic bubble memory device according to the present invention.
Figure 10:
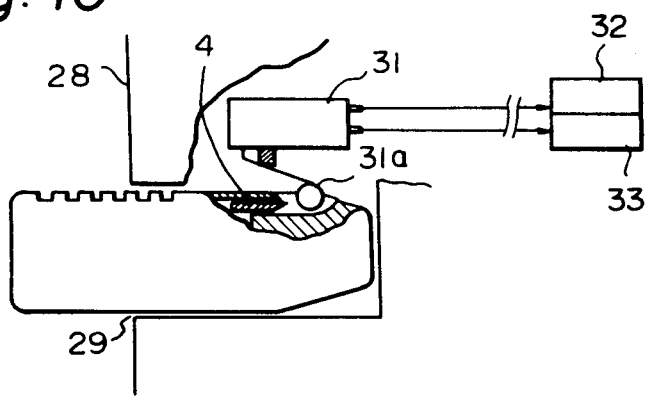

FIGS. 9 and 10 are sectional partial views illustrating schematically the structure of means for discriminating between the operating or closing state of the slide plate 4. In the drawings, a main apparatus 28, a receiving hole 29 and a micro-switch 31 are illustrated. When the above-mentioned magnetic bubble memory cassette is inserted into the receiving hole 29, the micro-switch 31 is put on or off according to the position of the slide plate 4, and signals of the micro-switch 31 are put in a magnetic bubble control circuit 32 (corresponding to the circuit 44 in FIG. 1) and a bubble reading circuit 33 (corresponding to the circuit 43 in FIG. 1), which are laid out in the main apparatus 28. FIG. 9 illustrates the state where the slide plate 4 is pulled out, and in this state, letters of "RECORD" on the body portion 18 of the slide plate 4 (see FIG. 6) can be seen from the outside of the cassette. This state is detected by the micro-switch 31 and a signal indicating that writing is possible is transmitted to the control circuit 32. In contrast, FIG. 10 illustrates the state where the slide plate 4 is pulled in the interior of the cassette. This state is detected by the micro-switch 31 and a signal inhibiting the writing operation is transmitted to the control circuit 32. Accordingly, at this point, no new information is written into the magnetic bubble memory element. From the viewpoint of fail-safe, it is preferred, that in the case where the direction of insertion of the cassette is the same as the sliding direction of the slide plate, the writing-inhibiting state be produced if the slide plate 4 is pulled into the cassette as shown in FIG. 10. In this case, if the slide plate 4 is erroneously caught on a certain obstacle (for example, a contact 31a of the micro-switch 31) at the time of insertion of the cassette into the main apparatus and when the slide plate 4 is opened simultaneously through the inserting operation, the writing-allowing state is switched over to the writing-inhibiting state and production of the writing-allowing state is prevented when writing should be inhibited. Accordingly, the state where already recorded information should not be erased, that is, the writing-inhibiting state, can be attained and maintained.

The bubble writing circuit (not shown) and bubble reading circuit 33 in the control circuit 32 are arranged so that they take up a logical product (AND) of the on-off signal of the micro-switch 31 and the signal of the bubble control circuit (not shown) (corresponding to the circuit 45 in FIG. 1) and supply writing operation and reading operation signals to the magnetic bubble memory device.

Another embodiment of the means for producing the writing-inhibiting state and the writing-allowing state in the cassette type magnetic bubble memory device will now be described with reference to FIGS. 11 through 14.

Figure 11:
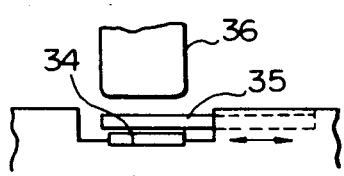
FIG. 11 is a diagram illustrating the principle of another embodiment of the cassette type magnetic bubble memory device according to the present invention.

Referring to FIG. 11, a magnetic shield plate 35 composed of a soft magnetic material, which acts as the slide plate, is disposed above a permanent magnet 34 having a thin plate-like shape so that the magnetic shield plate 35 can slide in both the directions indicated by arrows in FIG. 11. A magnetism-responding switch 36 is disposed to detect a magnetism. More specifically, the magnetic shield plate 35 is disposed between the permanent magnet 34 and the magnetism-responding switch 36, and in the state shown in FIG. 11, since the magnetic field generated by the permanent magnet 34 is short-circuited by the magnetic shield plate 35, the quantity of magnetic fluxes leaking beyond the magnetic shield plate 35 is small and the switch is kept in the "off" state. When the magnetic shield plate 35 is slid toward the position indicated by a dotted line in the drawings, the quantity of leaking magnetic fluxes is increased in the permanent magnet 34, and the switch 36 is turned to the "on" state. Accordingly, in this embodiment, the quantity of leaking magnetic fluxes of the permanent magnet 34 is changed and controlled by the sliding position of the magnetic shield plate 35 to effect the on-off driving of the switch 36.

Figure 12:
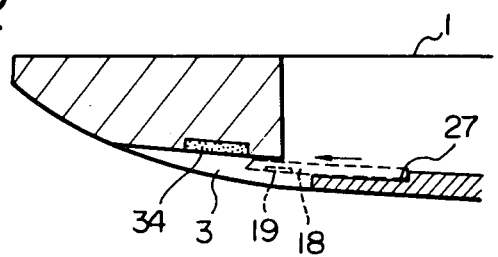
FIG. 12 is a sectional view, similar to FIG. 8, which illustrates the cassette type magnetic bubble memory device shown in FIG. 11.
Figure 13:
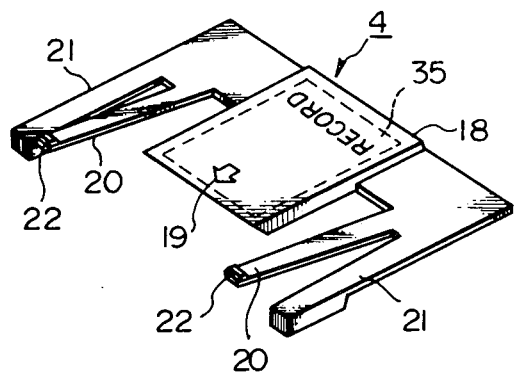
FIG. 13 is a perspective view illustrating a slide plate in the cassette type magnetic bubble memory device shown in FIG. 11.

FIG. 13 is a perspective view showing a slide plate 4 formed by using a mold, and the magnetic shield plate 35 is embedded in the operation portion 18 (body portion) of the slide plate 4 as indicated by a dotted line. As shown in FIG. 12, the permanent magnet 34 is embedded in the bottom (the upper portion in the drawings) of the concave portion 3 of the upper case 1.

Figure 14:
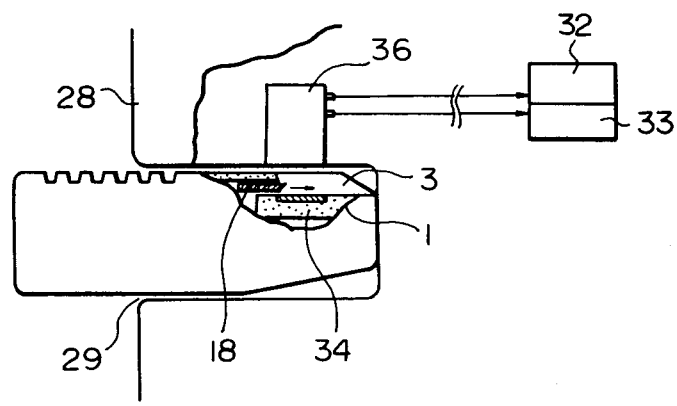
FIG. 14 is a sectional view showing the actual application state of the cassette type magnetic bubble memory device shown in FIG. 11.

In FIG. 14, reference numeral 28 represents a main apparatus having a circuit for driving and controlling the cassette type magnetic bubble memory device, and reference numeral 29 represents a receiving hole. As in the embodiment shown in FIGS. 9 and 10, when the cassette is inserted in the receiving hole 29, if the operation portion 18 is located at the position indicated in FIG. 14, the magnetism-responding switch 36 is actuated in the above-mentioned manner and a signal of the switch 36 is put in the bubble controlling circuit 32 and bubble reading circuit 33 of the main apparatus 28, whereby the state of inhibition of the writing operation in the magnetic bubble memory element is produced. On the other hand, in the state where the operation portion 18 is pulled out to the right along the direction of the arrows in the drawings, the magnetism-responding switch 36 is not actuated, and in this state, the writing operation in the magnetic bubble memory element by the circuits 32 and 33 is possible. Namely, the writing-allowing state is produced.

When the above-mentioned structure is adopted, since the positional condition of the slide plate for obtaining a signal inhibiting writing into bubbles in the cassette type magnetic bubble memory device is detected by the above-mentioned magnetic means, the detection reliability is improved over the reliability attained by the mechanical switch means, and furthermore, there are two other effects (a) prolonging the life of the magnetic bubble memory device, and (b) reducing the size thereof. Therefore, this embodiment is very advantageous from a practical viewpoint.

Incidentally, there may be used a Hall element or a magnetic resistance element and a lead switch as the magnetism-responding switch 36.

Figure 15:
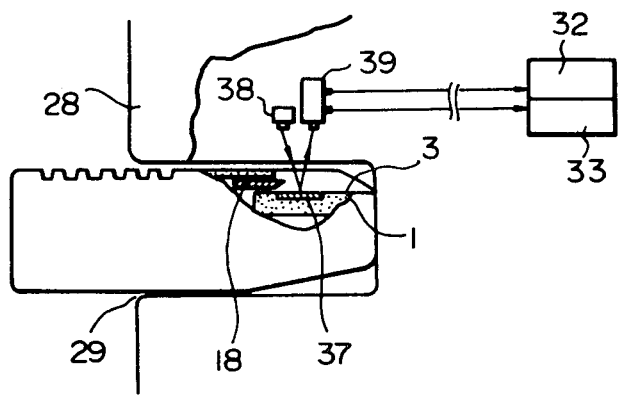
FIG. 15 is a sectional view showing the actual application state of still another embodiment of the cassette type magnetic bubble memory device according to the present invention.

Still another embodiment of the means for producing the writing-inhibiting or writing-allowing state in the cassette type magnetic bubble memory device will now be described with reference to FIG. 15. In this embodiment, a mirror 37 is embedded in the bottom of the recessed portion 3 of the upper case 1 of the cassette, and a light-emitting device 38 and a light detector 39 are disposed in the main apparatus 28. FIG. 15 illustrates the state where the body portion 18 of the slide plate 14 is pulled into the cassette. In this state, the light from the light-emitting device 38 is reflected on the mirror 37 and detected by the light detector 39. A detection signal is transmitted to the control circuit 32 and bubble reading circuit 33 to produce the writing-inhibiting state in the magnetic bubble memory device. Namely, writing of new information into the bubble memory element is inhibited and the already recorded information in the cassette is protected. If such optical means is used, an erroneous operation due to a mechanical element is not caused and it is not affected by the magnetism of a magnetic switching element. Therefore, the reliability of the magnetic bubble memory device can further be enhanced.

The lock mechanism for preventing separation of the cassette attached to the main apparatus while a revolving magnetic field is generated will now be described with reference to FIG. 16.

Figure 16:
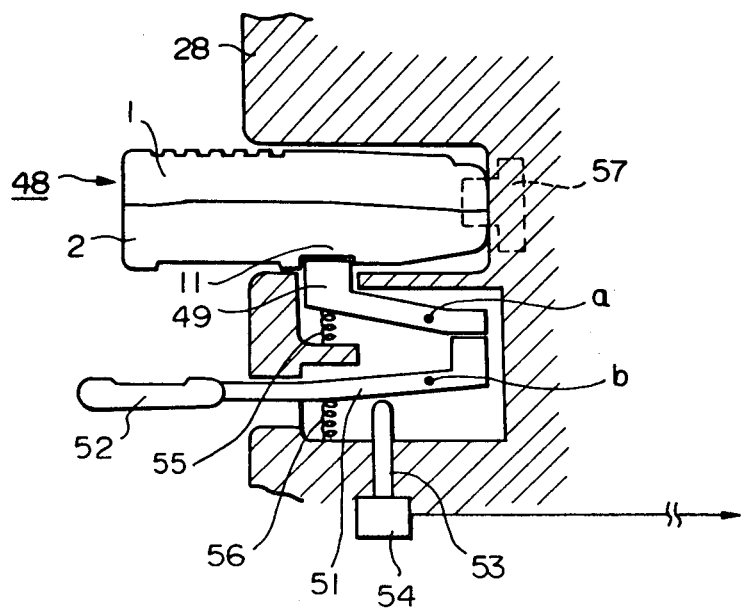
FIG. 16 is a sectional view illustrating a lock mechanism in the cassette type magnetic bubble memory device according to the present invention.

Referring to FIG. 16, a cassette 48 comprises upper and lower cases 1 and 2 and the cassette 48 is attached to a main apparatus 28. Reference numerals 49, 51, 52, 53, 54, 55, 56 and 57 represent a cassette-locking holder, an operation lever for operating the holder 49, a handle, a stopper for fixing the operation lever 51, a circuit for driving the stopper 53, a spring for supporting the holder 49, springs for supporting the operation lever 51 and a connector of the main apparatus to be joined with the connector of the cassette 48, respectively. Furthermore, the point a is a point for supporting the holder 49 and the point b is a point for supporting the operation lever 51.

When the cassette 48 is to be attached to the main apparatus 28, first, the operation lever 51 is turned, with the supporting point b acting as the pivotal center, by pushing down the handle 52, and simultaneously, the holder 49 is turned, with the supporting point a acting as the pivotal center. After the cassette 48 has been inserted into the main apparatus 28, by releasing the handle 52, the holder 49 and operation lever 51 are returned to the original positions by the action of the springs 55 and 56. When the main apparatus 28 has access to the cassette 48 and generates a revolving magnetic field, a driving signal is transmitted to the driving circuit 54. On receipt of the driving signal, the driving circuit 54 is actuated to push up the stopper 53, fix the operation lever 51 and hold the holder 49, whereby the cassette 48 is locked by a claw of the holder 49 fitted in the dent 11 and is prevented from separating from the main apparatus 28. When the cassette 48 is not used, the driving circuit 54 is not actuated, and when the handle 52 is pushed down, the cassette 48 can freely be separated from the main apparatus 28. On the other hand, while the cassette type magnetic bubble memory device is being used, that is, while a revolving magnetic field is generated, the cassette type magnetic bubble memory device is locked to the main apparatus. Therefore, destruction of the magnetic bubble memory by erroneous operation of the main apparatus and separation of the cassette during generation of a revolving magnetic field can be prevented.

In the embodiment shown in FIG. 16, the dent 11 for locking the cassette 48 has a square shape, but the shape of the locking dent 11 is not limited to only square shapes. Furthermore, the stopper and holder of the lock mechanism may be modified so that a pivotable rotary member is used as the holder and this holder is directly locked by the stopper. Moreover, there may be adopted a structure reverse to the structure of the above-mentioned embodiment. More specifically, there may be adopted a modification in which a projection is formed on the cassette 48 and a dent to be engaged with this projection is formed on the main apparatus 28.

The detecting device for detecting whether or not the cassette type magnetic bubble memory device is correctly inserted into the main apparatus, the operation state of this detecting device and the display means attached to this detecting device, will now be described with reference to FIGS. 17, 19 and 20.

Figure 17:
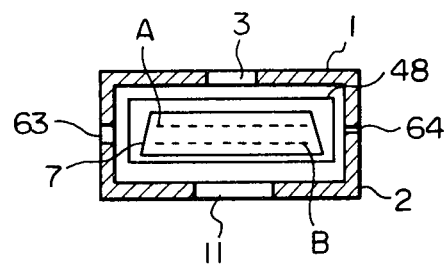
FIG. 17 is a back face view of the cassette type magnetic bubble memory device according to the present invention.
Figure 19:
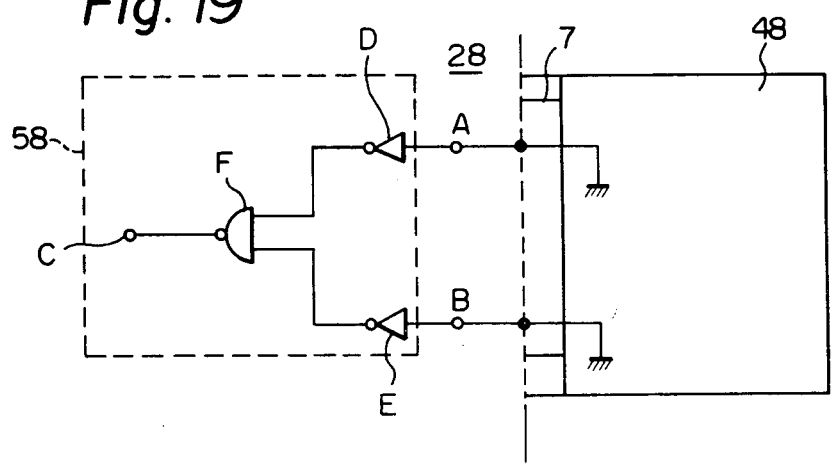
FIGS. 19 and 20 are circuit diagrams of the cassette type magnetic bubble memory device according to the present invention.

In FIG. 17, terminals A and B are for detecting the cassette-inserting state, and in FIG. 19, reference numeral 58 represents a device for detecting the insertion state of the cassette, reference symbols D and E represent inverters, and reference symbols F and C represent a NAND circuit and an output terminal, respectively. In FIG. 20, reference numeral 59 represents a display lamp actuated by an output signal of the insertion state-detecting device 58, reference numeral 61 represents a device for detecting the operation state of the magnetic bubble memory device, and reference numeral 62 represents a state-indicating display lamp.

As shown in FIG. 19, in the state where the cassette 48 is correctly inserted and attached, signals obtained from the terminals A and B are put into the NAND circuit F through the inverters D and E and put out to the output terminal C. The display lamp 59 illustrated in FIG. 20 is lighted by these output signals. Thus, correct attachment of the cassette 48 to the main apparatus 28 can be indicated by the display lamp 59. As shown in FIG. 17, the detection terminals A and B are arranged on both ends of the diagonal line, respectively. Accordingly, the junction of the connectors can be detected very precisely when the cassette 48 is inserted.

Figure 20:
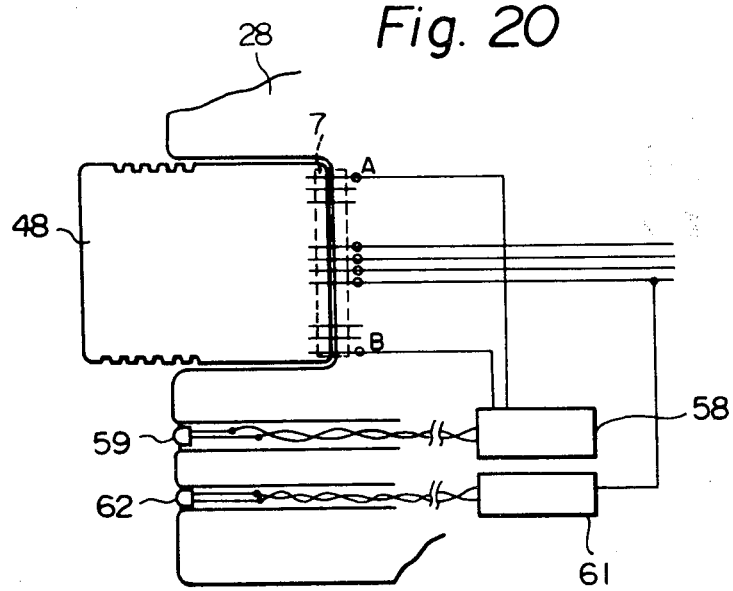

As shown in FIG. 20, a circuit for returning to the main apparatus the signal indicating the state whether the reading operation is carried out or the writing operation is carried out in the main apparatus 28 is laid out on the cassette 48, and this state is indicated by the display lamp 62 of the main apparatus 28 by the operation state-detecting circuit 61 in the same manner as the lamp 59 is lighted by the insertion state-detecting circuit 58.

By adoption of the above-mentioned structure, the insertion state and operation state of the cassette can be visually indicated by lamps, and one resulting advantage is that, the cassette type magnetic bubble memory device can be used very easily and conveniently even on a man-machine interface.

The mechanism for preventing converse insertion of the cassette through guide grooves 9 on attachment of the cassette of the present invention to the main apparatus will now be described with reference to FIGS. 17 and 18.

Figure 18:
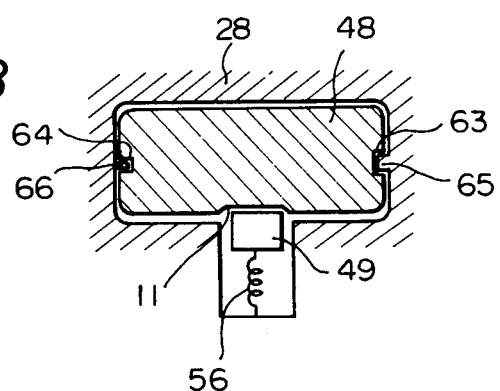
FIG. 18 is a view showing the vertical section in the lateral direction of the cassette type magnetic bubble memory device according to the present invention.

FIG. 17 illustrates the side of the cassette seen from the direction of the connector face, and FIG. 18 shows the section of the cassette attached to the main apparatus, seen from the insertion direction. In FIG. 18, reference numerals 63 and 64 represent guide grooves differing in the groove width, and reference numerals 65 and 66 represent guide rails mounted on the main apparatus, which are to be engaged with the guide grooves 63 and 64, respectively.

The joining face of the connector 7 shown in FIG. 17 is formed to have a trapezoidal shape so that if the cassette is being inserted into the main apparatus in the converse state, that is, in the inverted upside down state, the insertion is inhibited by this trapezoidal configuration.

Furthermore, the guide rails 65 and 66 and the guide grooves 63 and 64 are arranged as illustrated in FIG. 18, so that insertion of the cassette in an inverted state is prevented by these guide rails and guide grooves.

As will readily be understood from the foregoing illustration, according to the present invention, by provision of the lock mechanism for preventing separation of the cassette type bubble memory device during generation of a revolving magnetic field, destruction of bubbles by erroneous operation of the main apparatus can be prevented reliably. Furthermore, because the grooves to be engaged with the guide rails of the cassette type bubble memory device are made different from each other in width, destruction of bubbles by erroneous insertion of the cassette type bubble memory device can be prevented. Furthermore, another advantage is that the reliability of the bubble memory device can be enhanced by these mechanisms having a very simple structure.

Figure 22:
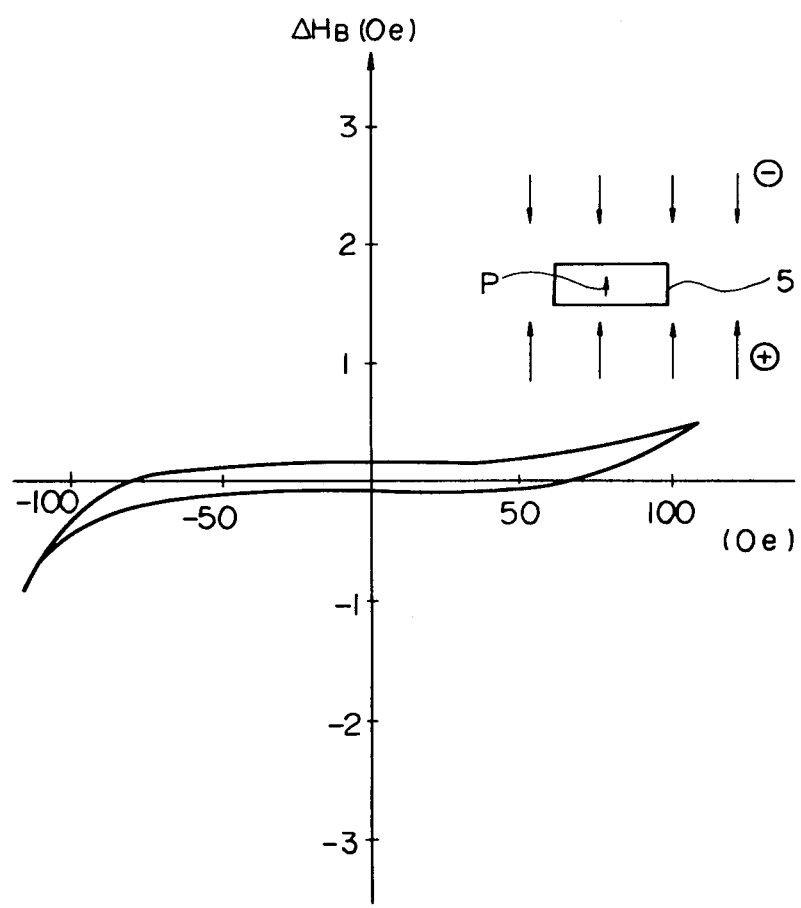
FIG. 22 is a graph showing the disturbance magnetic field resistance characteristic of the magnetic bubble memory element placed under a uniform magnetic field.

FIG. 22 illustrates the disturbance resistance characteristic of the magnetic bubble memory element 5 in a uniform magnetic field. It is shown that when a disturbance magnetic field is applied in the direction ⊖, the bias magnetic field value of the magnetic bubble memory element is reduced and when a disturbance magnetic field is applied in the direction ⊕, the bias magnetic field value is increased. In FIG. 22, the abscissa indicates the intensity of the disturbance magnetic field and the ordinate shows the change of the bias magnetic field value in the magnetic bubble memory element. The direction of the bias magnetic field in the magnetic bubble memory element 5 is indicated by arrow P. The disturbance magnetic field applied in the same direction as the direction of the arrow P is designated as the disturbance magnetic field ⊕, and the disturbance magnetic field applied in the direction opposite to the direction of the arrow P is designated as the disturbance magnetic field ⊖. As is seen from FIG. 22, when a disturbance magnetic field of about 50 to about 100 Oe is applied, the change of the bias magnetic field value is ordinarily within 0.5 Oe, and the influence of such disturbance magnetic field to the action of bubbles can be overlooked. However, if a uniform magnetic field of a much higher intensity is applied, the influence on the action of bubbles is increased. For example, this will take place when the magnetic bubble memory element is placed in a magnetic field of a permanent magnet having a much larger magnetic force than the bias magnetic force of the magnetic bubble memory element or when the magnetic bubble memory element is located in the vicinity of a very strong electromagnetic. Indeed, application of such uniform magnetic field can be avoided if attention is paid to the position in which the cassette is used. However, small permanent magnets are present here and there and such small permanent magnets locally produce a strong magnetic field acting as a strong disturbance magnetic field. Since it often happens that such substances producing locally a strong magnetic field are present in the vicinity of the cassette, a special measure coping with a disturbance magnetic field produced by such substances is required.

Figure 23:
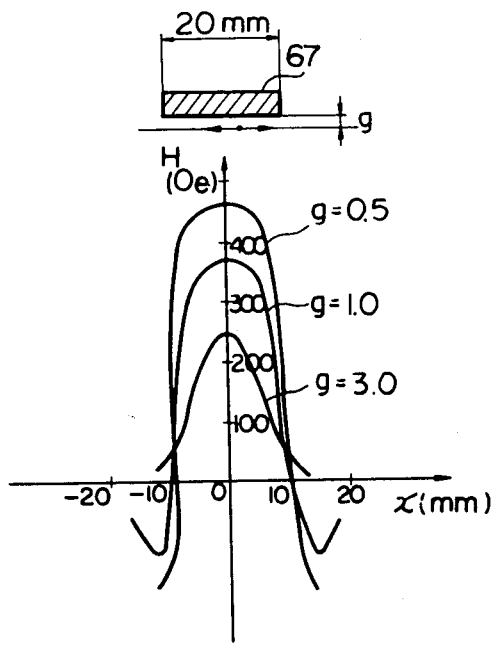
FIG. 23 is a graph showing one example of the magnetic field distribution of a permanent magnet.
Figure 24:
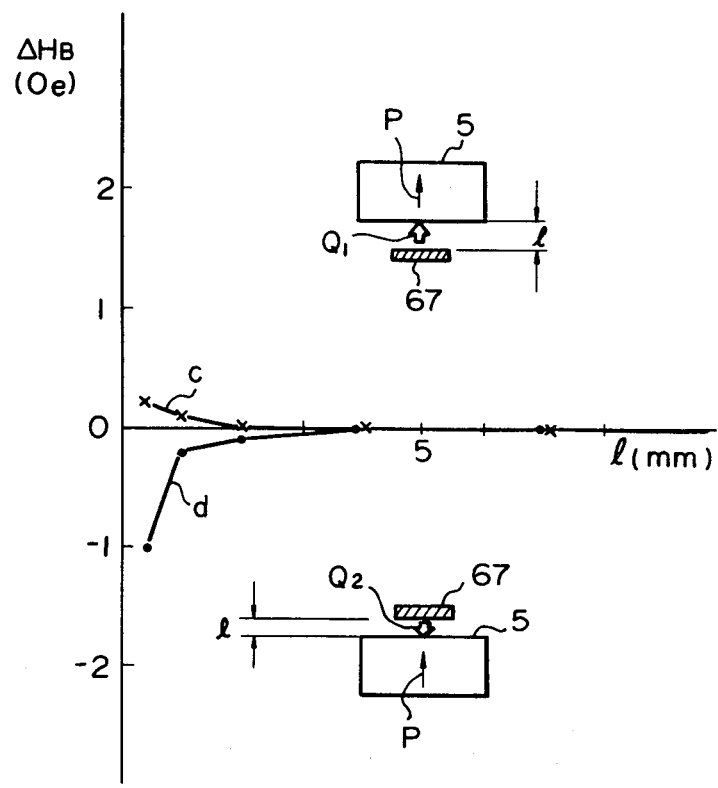
FIG. 24 is a graph showing a disturbance magnetic field produced when the permanent magnet shown in FIG. 23 is brought close to the magnetic bubble memory element.

FIG. 23 illustrates the magnetic field distribution of a columnar permanent magnet having a diameter of 20 mm as an example of a substance producing a disturbance magnetic field, and FIG. 24 illustrates the change of the bias magnetic field of the magnetic bubble memory element, which is observed when the permanent magnet shown in FIG. 23 is brought close to the magnetic bubble memory element.

In FIG. 23, the abscissa indicates the distance from the center of the permanent magnet 67 and the ordinate indicates the intensity of the magnetic field at the position apart from the permanent magnet 67 by distance g. In FIG. 24, the abscissa indicates the distance between the permanent magnet 67 and the magnetic bubble memory element 5 and the ordinate indicates the change of the bias magnetic field value in the magnetic bubble memory element 5. The line c shows results obtained when the direction Q1 of the magnetic field of the permanent magnet 67 is the same as the direction P of the bias magnetic field of the magnetic bubble memory element 5 and the line d shows results obtained when the direction Q2 of the magnetic field of the permanent magnet 67 is opposite to the direction P of the bias magnetic field of the magnetic bubble memory element 5.

As is seen from these FIGS., even if there is present a substance producing locally a strong magnetic field of about 400 to about 500 Oe, when this substance is separated from the magnetic bubble memory element by at least about 3 mm, the magnetic bubble memory element is not influenced at all by such a substance. Accordingly, in this case, information in the magnetic bubble memory element is not destroyed at all and there is not a fear of erroneous operation at all.

Figure 21:
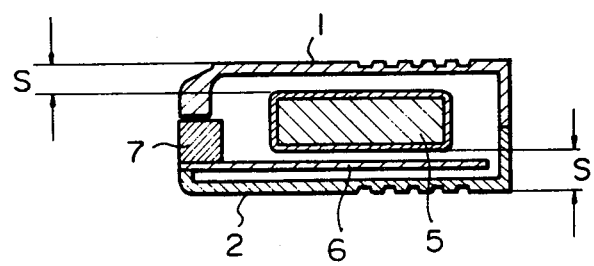
FIG. 21 is a view showing the vertical section in the longitudinal direction of the cassette type magnetic bubble memory device according to the present invention.

Therefore, if the cassette is arranged so that the distance S between each of the surfaces of the upper and lower cases 1 and 2 and the magnetic bubble memory element 5 is at least about 3 mm as illustrated in FIG. 21, the cassette can exert a sufficiently high disturbance magnetic field resistance to a substance producing locally a strong disturbance magnetic field and the reliability of the cassette type magnetic bubble memory device can be remarkably enhanced.

We claim:

1. A cassette type magnetic bubble memory device which is dismountably attached to a main apparatus having a bubble driving circuit, a bubble writing circuit and a bubble reading circuit and which comprises:
   (a) a case having a recessed portion formed thereon and at least one arm-guiding groove and anchoring grooves formed at both ends of said at least one arm-guiding groove;
   (b) a magnetic bubble memory element contained in the case, including a bubble chip, a coil for producing a revolving magnetic field and a magnet for producing a bias magnetic field; and
   (c) writing-inhibiting means including a slide plate mounted on the surface of said case for holding the state of inhibition of the writing operation to said magnetic bubble memory element and having at least one elastic arm slidable in said at least one arm-guiding groove and a projection formed on the top end of the arm and engaged with one of the anchoring grooves to hold the slide plate at an open or closed position, said writing-inhibiting means being arranged so that the state of inhibition of the writing operation can be switched by manual operation wherein the state of inhibition of the writing operation and the state of allowance of the writing operation are set by closing of the recessed portion formed on said case by said slide plate and opening of said recessed portion by said slide plate, respectively; and
wherein the cassette type magnetic bubble memory device is insertably attached into said main apparatus, and wherein the sliding direction of the slide plate is the same as the insertion direction of the cassette type magnetic bubble memory device into said main apparatus and when the slide plate is non-intentionally slid connectively with the operation of insertion of the cassette type magnetic bubble memory device, the state of inhibition of the writing operation is set.

2. A cassette type magnetic bubble memory device as set forth in claim 1, wherein detection of the slide position of said slide plate is accomplished by optical means.

3. A cassette type magnetic bubble memory device as set forth in claim 1, further comprising switch means for discriminating between the state of inhibition of the writing operation and the state of allowance of the writing operation in the writing-inhibiting means and wherein the writing operation to the magnetic bubble memory element is controlled by said switch means, said switch means having a magnetic-responding switch, a permanent magnet embedded in the bottom of the concave portion of the case, and a magnetic shield plate formed in the slide plate disposed between said switch and said permanent magnet and wherein the switch provides a signal indicating the state of allowance of the writing operation when the slide plate is in the closed position and a signal indicating the state of inhibition of the writing operation when the slide plate is in the open position.

4. The cassette type magnetic bubble memory device of claim 1, further comprising switch means for discriminating between the state of inhibition of the writing operation and the state of allowance of the writing operation in the writing-inhibiting means and wherein the writing operation to the magnetic bubble memory element is controlled by said switch means, said switch means having a light-emitting device and light detector disposed in the main apparatus and a mirror embedded in the bottom of the recessed portion of the case and wherein the light detector provides a signal indicating the state of allowance of the writing operation when the slide plate is in the closed position and a signal indicating the state of inhibition of the writing operation when the slide plate is in the open position.

5. A cassette type magnetic bubble memory device as set forth in claim 1, wherein detection of the slide position of said slide plate is accomplished by magnetic means.

6. A cassette type magnetic bubble memory device as set forth in claim 5, wherein said magnetic means is a permanent magnetic disposed below the slide plate of the case, the slide plate is formed of a magnetic material and a magnet-responding switch is disposed so that the switch controls the writing operation in the magnetic bubble memory element according to the quantity of magnetic fluxes leaking through said slide plate.

7. A cassette type magnetic bubble memory device as set forth in claim 1 further comprising switch means for discriminating between the state of inhibition of the writing operation and the state of allowance of the writing operation in the writing-inhibiting means and wherein the writing operation to the magnetic bubble memory element is controlled by said switch means.

8. A cassette type magnetic bubble memory device as set forth in claim 1 or 7, wherein the distance between the surface of the case and the magnetic bubble memory element is adjusted so that the magnetic bubble memory element is not substantially influenced by a disturbance magnetic field.

9. A cassette type magnetic bubble memory device as set forth in claim 8, further comprising a cassette attachment-detecting circuit and wherein the cassette type magnetic bubble memory device has a connector with a plurality of terminals, two terminals being connectable to the cassette attachment-detecting circuit.

10. A cassette type magnetic bubble memory device as set forth in claim 1 or 7, wherein said main apparatus has an anchoring claw with said case recessed portion, and while said magnetic bubble memory device is attached to the main apparatus and is driven by the main apparatus, the magnetic bubble memory device cannot be separated from the main apparatus.

11. The cassette type magnetic bubble memory device of claim 7, wherein said switch means comprises a micro-switch.

12. The cassette type magnetic bubble memory device of claim 7, wherein said switch means comprises a magnetic-switch.

13. The cassette type magnetic bubble memory device of claim 7, wherein said switch means comprises an optical-switch.

14. The cassette type magnetic bubble memory device of claim 7, wherein said switch means comprises a micro-switch having a contact engageable with said slide plate in the closed position to provide a signal indicating the state of allowance of the writing operation and wherein the micro-switch provides a signal indicating the state of inhibition of the writing operation when the slide plate is in the open position.

15. A cassette type magnetic bubble memory device as set forth in claim 10, wherein a guide groove is formed on each of both side surfaces of said case, and guide members which fit into said guide grooves, respectively, are formed on said main apparatus so as to support said case, and wherein the widths of said guide grooves are different from each other so that insertion of the cassette in an inversed state is prevented.

16. A cassette type magnetic bubble memory device as set forth in claim 10, wherein the distance between the surface of the case and the magnetic bubble memory element is adjusted so that the magnetic bubble memory element is not substantially influenced by a disturbance magnetic field.

17. A cassette type magnetic bubble memory device as set forth in claim 10, further comprising a cassette attachment-detecting circuit and wherein the cassette type magnetic bubble memory device has a connector with a plurality of terminals, two terminals being connectable to the cassette attachment-detecting circuit.

18. A cassette magnetic bubble memory device which is dismountably attached to a main apparatus having a bubble driving circuit, a bubble writing circuit and a bubble reading circuit and which comprises:
 (a) a case having a recessed portion formed thereon;
 (b) a magnetic bubble memory element contained in the case, including a bubble chip, a coil for producing a revolving magnetic field and a magnet for producing a bias magnetic field;
 (c) writing-inhibiting means including a slide plate mounted on the surface of said case for holding the state of inhibition of the writing operation to said magnetic bubble memory element, said writing-inhibiting means being arranged so that the state of inhibition of the writing operation and the state of allowance of the writing operation can be switched by manual operation wherein the state of inhibition of the writing operation and the state of allowance of the writing operation are set by closing of the recessed portion formed on said case by said slide plate and opening of said recessed portion by said slide plate, respectively; and
 (d) switch means for discriminating between the state of inhibition of the writing operation and the state of allowance of the writing operation in the writing-inhibiting means and wherein the writing operation to the magnetic bubble memory element is controlled by said switch means, wherein said switch means comprises a magnetic-responding switch, a permanent magnet embedded in the bottom of the recessed portion of the case, and a magnetic shield plate formed in the slide plate disposed between said switch and said permanent magnet and wherein the switch provides a signal indicating the state of allowance of the writing operation when the slide plate is in the closed position and a signal indicating the state of inhibition of the writing operation when the slide plate is in the open position.

* * * * *

UNITED STATES PATENT AND TRADEMARK OFFICE
CERTIFICATE OF CORRECTION

PATENT NO.   :   4,459,679

DATED        :   July 10, 1984

INVENTOR(S)  :   Sukeda et al.

It is certified that error appears in the above-identified patent and that said Letters Patent is hereby corrected as shown below:

```
Front page, [54], in the title, delete "DEVICE";
Front page, [57], in the Abstract, line 4, delete "which".
Column 5, line 54, "concave" should be --recessed--.
```

Signed and Sealed this

Eighth Day of January 1985

[SEAL]

Attest:

Attesting Officer

GERALD J. MOSSINGHOFF

*Commissioner of Patents and Trademarks*